(12) United States Patent
Yoneda et al.

(10) Patent No.: US 10,720,752 B2
(45) Date of Patent: Jul. 21, 2020

(54) SUBMOUNT AND SEMICONDUCTOR LASER DEVICE

(71) Applicant: NICHIA CORPORATION, Anan-shi, Tokushima (JP)

(72) Inventors: Akinori Yoneda, Anan (JP); Shinya Sonobe, Tokushima (JP); Hiroaki Yuto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/031,683

(22) Filed: Jul. 10, 2018

(65) Prior Publication Data

US 2018/0316157 A1 Nov. 1, 2018

Related U.S. Application Data

(62) Division of application No. 14/920,134, filed on Oct. 22, 2015, now Pat. No. 10,050,411.

(30) Foreign Application Priority Data

Oct. 24, 2014 (JP) ................................ 2014-217840

(51) Int. Cl.
*H01S 5/022* (2006.01)
*C25D 3/38* (2006.01)
(Continued)

(52) U.S. Cl.
CPC ........ *H01S 5/02272* (2013.01); *C23C 14/185* (2013.01); *C23C 14/34* (2013.01);
(Continued)

(58) Field of Classification Search
CPC ............. H01S 5/02272; H01S 5/02236; H01S 5/02212; C23C 14/185; C23C 14/34; C25D 7/123; C25D 3/38; C25D 5/022
See application file for complete search history.

(56) References Cited

U.S. PATENT DOCUMENTS 5,856,231 A    1/1999  Niemann et al.
6,214,108 B1 * 4/2001  Okamoto ................ C30B 23/00
                                                    117/88

(Continued)

FOREIGN PATENT DOCUMENTS

JP      2000-034199 A     2/2000
JP      2001158696 A *    6/2001 ............. C30B 29/36
(Continued)

OTHER PUBLICATIONS

English Translation of JP2001-158696 (Year: 2001).*
English Abstract of JP2005-217290 (Year: 2005).*

*Primary Examiner* — Yuanda Zhang
(74) *Attorney, Agent, or Firm* — Squire Patton Boggs (US) LLP

(57) ABSTRACT

The method includes the steps of: preparing a single crystal SiC including an upper surface 10a and a lower surface 10b and provided with a micropipe 11 penetrating from the upper surface 10a to the lower surface 10b; forming a first seed layer 21 made of a metal material on the upper surface 10a of the single crystal SiC; and forming a first plated layer 31 on the first seed layer 21 so as to close an upper end of the micropipe 11, using an electroplating method.

15 Claims, 22 Drawing Sheets

(51) Int. Cl.
*C25D 7/12* (2006.01)
*C25D 5/02* (2006.01)
*C23C 14/34* (2006.01)
*C23C 14/18* (2006.01)

(52) U.S. Cl.
CPC ............... *C25D 3/38* (2013.01); *C25D 5/022* (2013.01); *C25D 7/123* (2013.01); *H01S 5/02236* (2013.01); *H01S 5/02212* (2013.01)

(56) References Cited

U.S. PATENT DOCUMENTS

| | | | |
|---|---|---|---|
| 6,596,133 | B1 | 7/2003 | Moslehi et al. |
| 7,714,341 | B2 | 5/2010 | Chil Keun et al. |
| 2006/0249745 | A1 | 11/2006 | Chae et al. |
| 2011/0128980 | A1* | 6/2011 | Kato .................... H01L 33/0095 372/43.01 |
| 2012/0263200 | A1 | 10/2012 | Tamaya et al. |
| 2013/0022069 | A1* | 1/2013 | Lee ..................... H01S 5/02292 372/38.02 |
| 2014/0112363 | A1* | 4/2014 | Feitisch ............... B23K 20/023 372/43.01 |
| 2014/0321491 | A1* | 10/2014 | Sakata ................ H01S 5/02276 372/44.01 |
| 2015/0179895 | A1 | 6/2015 | Herner et al. |

FOREIGN PATENT DOCUMENTS

| | | | | |
|---|---|---|---|---|
| JP | 2005217290 A | * | 8/2005 | ............. H01L 23/36 |
| JP | 2006-313907 A | | 11/2006 | |
| JP | 2006-344743 A | | 12/2006 | |
| JP | 2009012998 A | * | 1/2009 | ........... H01L 21/205 |
| WO | 2011/074262 A1 | | 6/2011 | |

\* cited by examiner

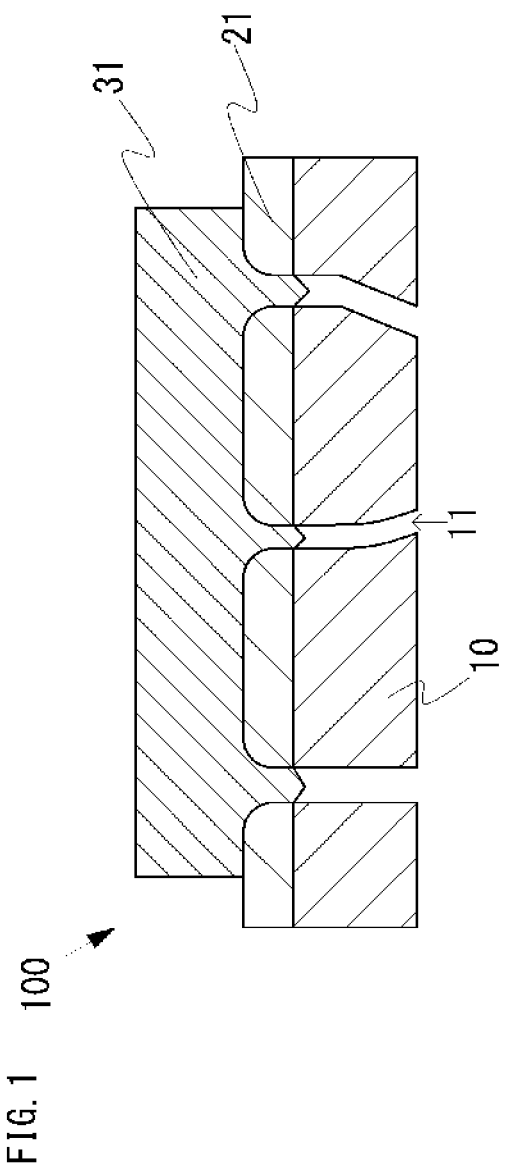

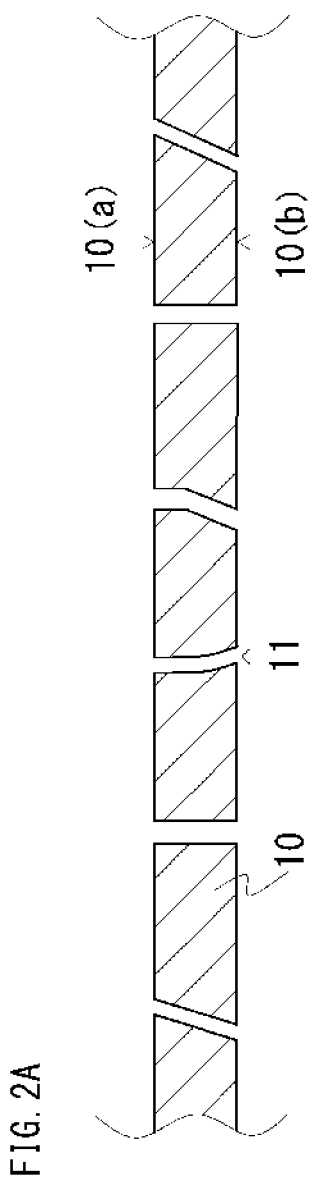

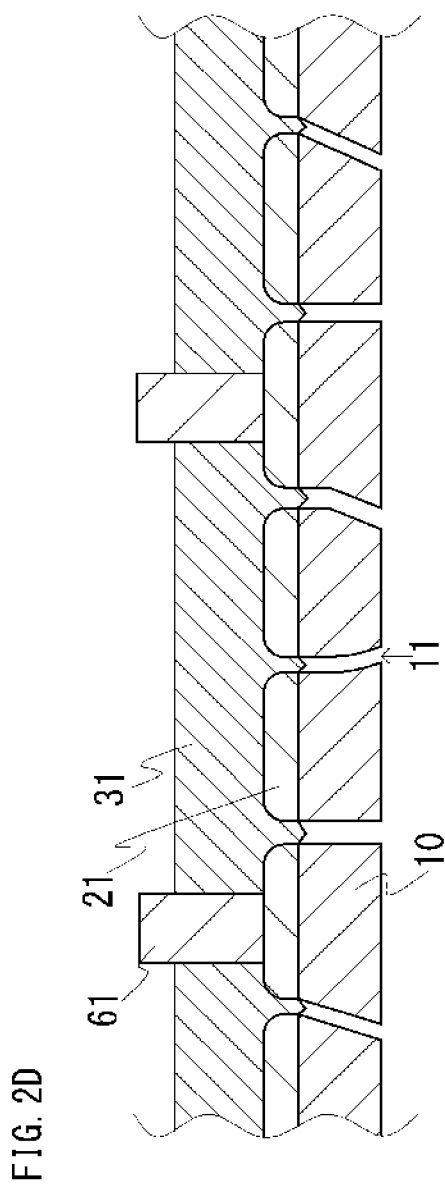

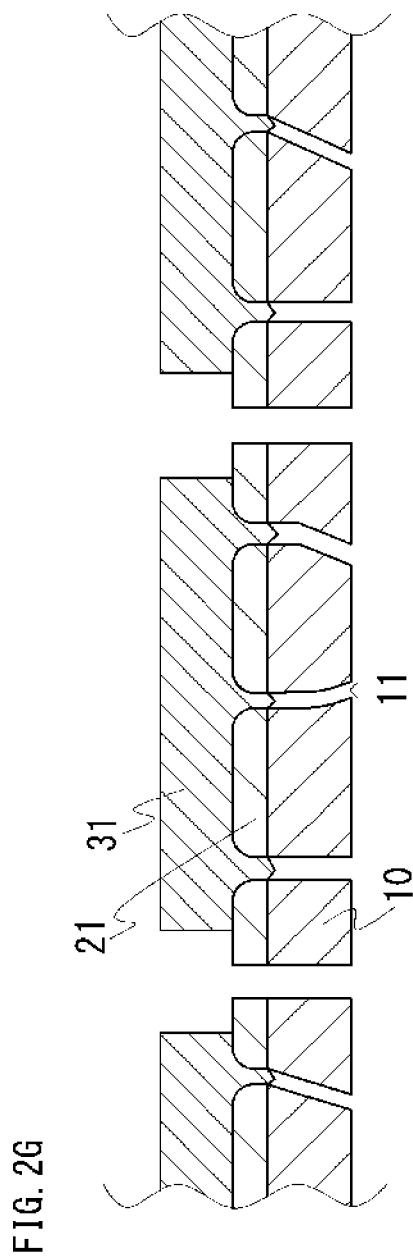

61  11  10

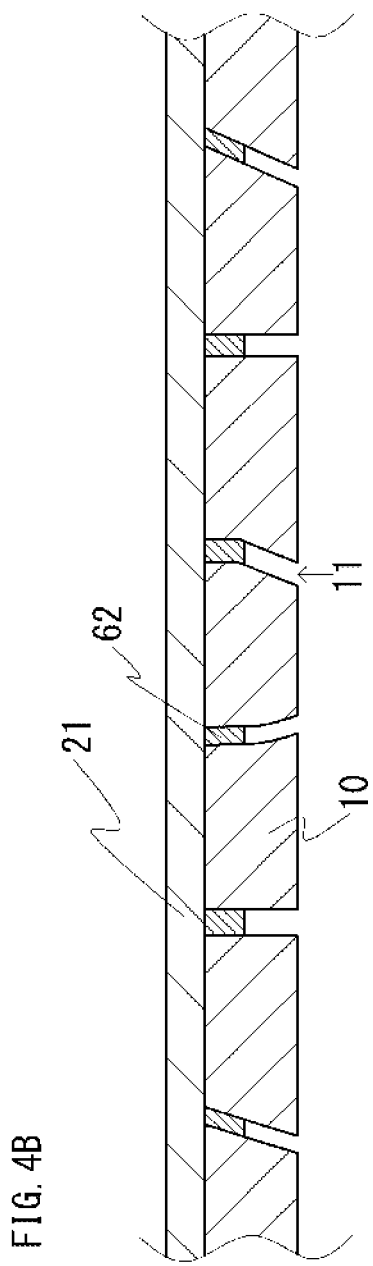

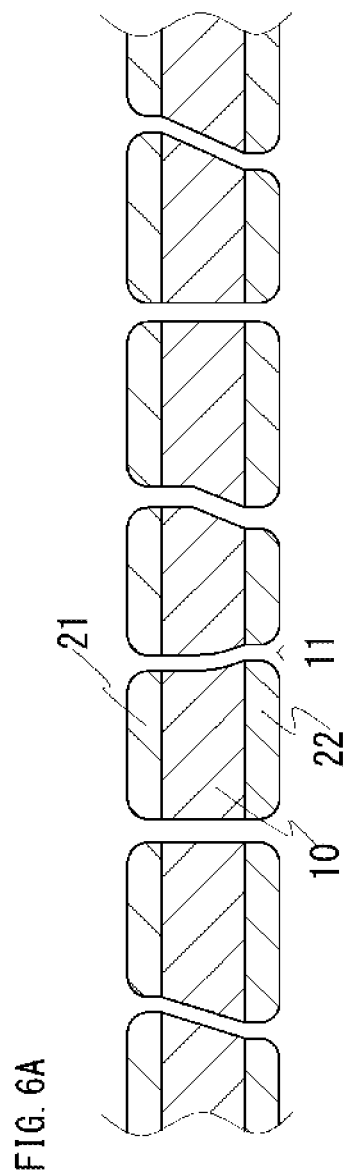

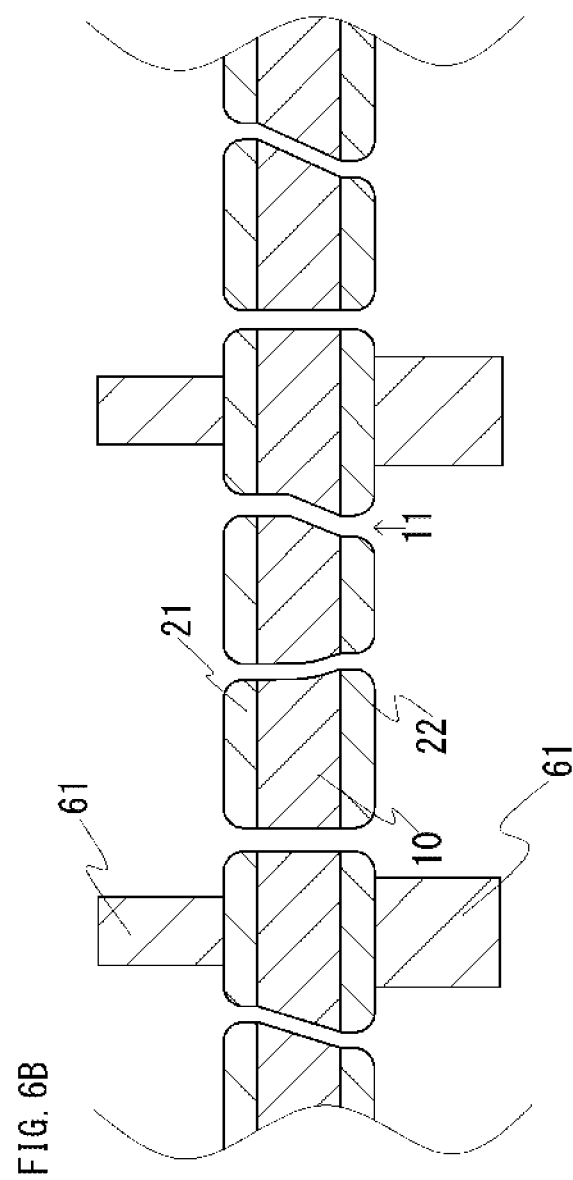

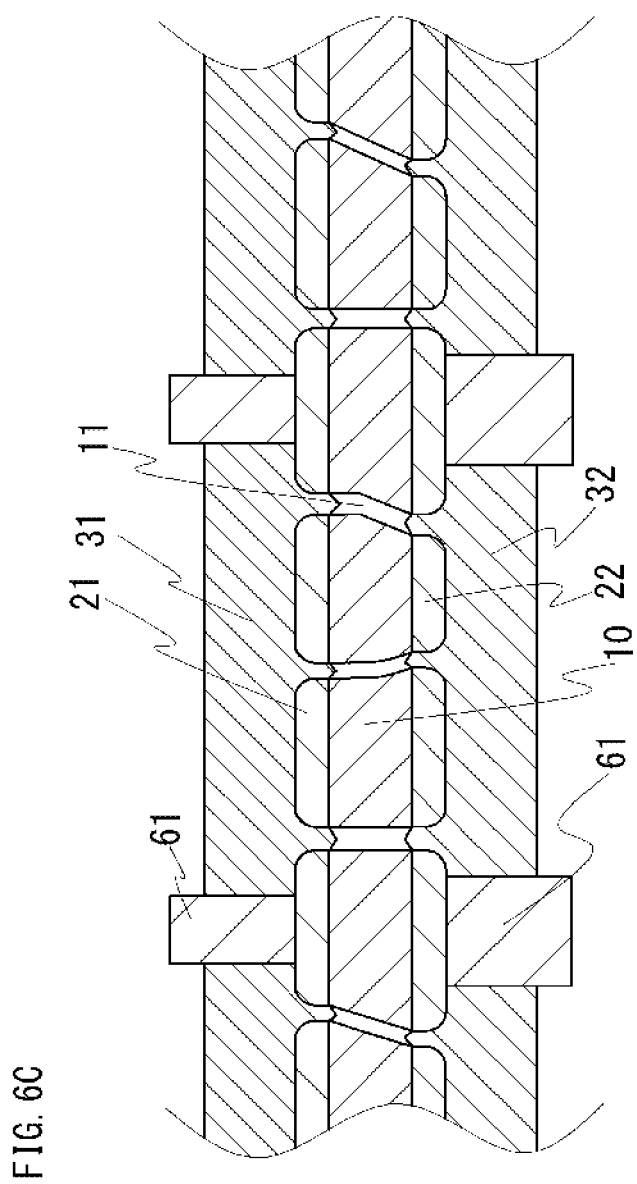

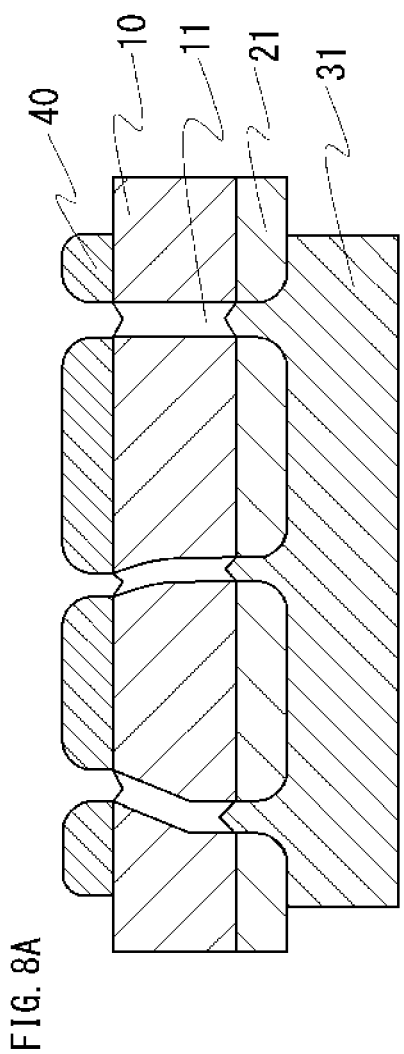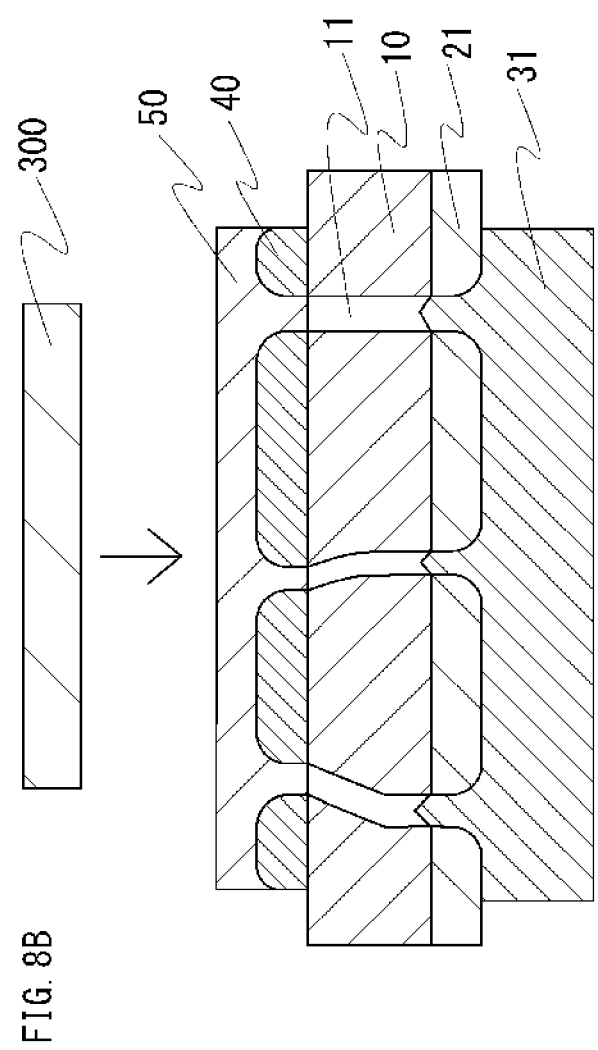

SUBMOUNT AND SEMICONDUCTOR LASER DEVICE

CROSS-REFERENCE TO RELATED APPLICATIONS

The present application is a Divisional of co-pending application Ser. No. 14/920,134, filed on Oct. 22, 2015, which claims priority to Japanese Patent Application No. 2014-217840, filed on Oct. 24, 2014. The entire content of all of the above referenced applications are hereby incorporated by reference.

BACKGROUND

Field

The present invention relates to a manufacturing method of a semiconductor laser device that uses a single crystal SiC as a submount.

Description of the Related Art

In a manufacturing method of a silicon carbide (SiC) single crystal described in Japanese Patent Application Laid-open No. 2000-34199 (hereinafter, also referred to as a "conventional manufacturing method"), a coating material made of a metal material is formed on one surface of a SiC substrate including a micropipe. In this method, the micropipe is closed such that the coating material is formed by using a chemical vapor deposition (CVD) method, a sputter vapor deposition method, or the like and then a heat treatment is performed (for example, refer to paragraphs 14 and 15).

However, the conventional manufacturing method uses a heat treatment which requires a long period of time. In addition, even with the use of the coating material made of a metal material, a micropipe with a large diameter may be left in a penetrating state without being completely closed. In Japanese Patent Application Laid-open No. 2000-34199, a SiC substrate is used as a substrate for epitaxial growth. Using the SiC substrate in Japanese Patent Application Laid-open No. 2000-34199 as a submount on which a semiconductor laser element is to be mounted may possibly result in penetration by a conductive member such as a eutectic solder into the micropipe. In this case, an insulating property of the single crystal SiC is destroyed and the semiconductor laser device using the single crystal SiC becomes defective.

The present invention is devised to provide a submount capable of reliably closing the micropipe to restraining a decline in insulating property attributable to a micropipe, a manufacturing method of the submount, a semiconductor laser device using a single crystal SiC as a submount, and a manufacturing method of the semiconductor laser device.

SUMMARY

A manufacturing method of a submount according to an embodiment of the present invention includes preparing a single crystal SiC including an upper surface and a lower surface and provided with a micropipe penetrating from the upper surface to the lower surface; forming a first seed layer made of a metal material on the upper surface of the single crystal SiC; and forming a first plated layer on the first seed layer so as to close an upper end of the micropipe, using an electroplating method.

In addition, a submount according to an embodiment of the present invention includes: a single crystal SiC including an upper surface and a lower surface and provided with a micropipe penetrating from the upper surface to the lower surface; a first seed layer made of a metal material and provided on the upper surface of the single crystal SiC; and a first plated layer provided on an upper surface of the first seed layer so as to close an upper end of the micropipe.

According to the manufacturing method of a submount described above, a submount that suppresses a decline in insulating property attributable to a micropipe due to being capable of reliably closing the micropipe can be easily manufactured.

In addition, according to the submount described above, a submount that suppresses a decline in insulating property attributable to a micropipe due to the micropipe being reliably closed may be obtained.

BRIEF DESCRIPTION OF THE DRAWINGS

FIG. 1 is a schematic sectional view of a submount 100 according to a first embodiment;

FIGS. 2A to 2G are schematic sectional views for explaining a manufacturing method of the submount 100 according to the first embodiment;

FIGS. 4A and 4B are schematic sectional views for explaining a modification of the manufacturing method of the submount 100 according to the first embodiment;

FIGS. 6A to 6F are schematic sectional views for explaining a manufacturing method of the submount 200 according to the second embodiment;

FIGS. 8A and 8B are schematic sectional views for explaining a manufacturing method of the semiconductor laser device 500 according to the third embodiment.

DETAILED DESCRIPTION

Figure 2B:
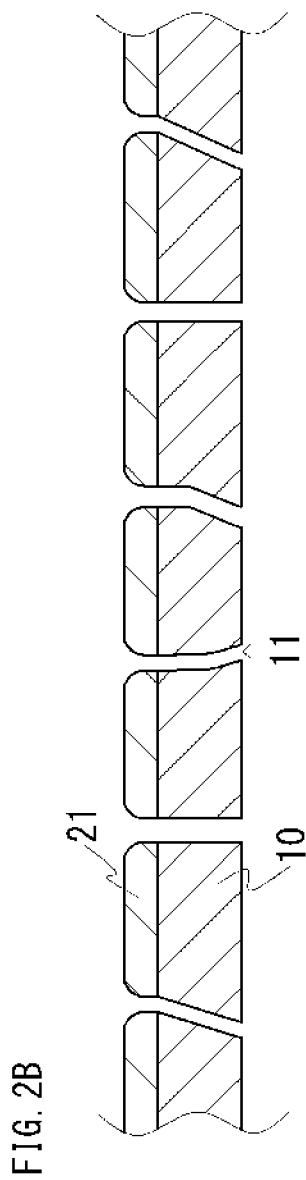

Hereinafter, embodiments of the present invention will be described with reference to the drawings. It is to be understood that the modes described below are merely examples for giving concrete shapes to the technical concepts of the present invention and are not intended to limit the present invention to the following. In addition, it should be noted that sizes, positional relationships, and the like of members shown in the drawings may sometimes be exaggerated in order to facilitate understanding. Furthermore, in principle, same names and reference characters denote equal or identical members and overlapping descriptions will be omitted as appropriate. Moreover, it is to be assumed that at least one of each member may suffice but each member may be provided in plurality.

First Embodiment

FIG. 1 shows a submount 100 according to the present embodiment.

The submount 100 includes: a single crystal SiC 10 including an upper surface 10a and a lower surface 10b and provided with a micropipe 11 penetrating from the upper surface 10a to the lower surface 10b; a first seed layer 21 made of a metal material and provided on the upper surface 10a of the single crystal SiC; and a first plated layer 31 which is provided on an upper surface of the first seed layer 21 and which closes an upper end of the micropipe 11.

Accordingly, a submount in which the micropipe 11 is reliably closed can be obtained. In addition, while a crack may occur due to a load or a difference in thermal expansion coefficients when mounting the single crystal SiC 10 on another member (for example, a base 400), since such stress can be absorbed by the first plated layer 31, an occurrence of a crack can be suppressed.

In addition, a manufacturing method of the submount 100 includes the steps of: preparing a single crystal SiC 10 including an upper surface 10a and a lower surface 10b and provided with a micropipe 11 penetrating from the upper surface 10a to the lower surface 10b; forming a first seed layer 21 made of a metal material on the upper surface 10a of the single crystal SiC; and forming a first plated layer 31 on the first seed layer 21 so as to close an upper end of the micropipe 11, using an electroplating method.

Accordingly, the submount 100 which reliably closes the micropipe 11 can be manufactured. A detailed description of the above will be given below.

Conventionally, a sputtering method, a vapor deposition method, or the like has typically been used as a method of closing a micropipe. However, with these methods, there are cases where a micropipe with a large diameter cannot be completely closed and a penetrating part remains in the micropipe. In addition, since these methods form a film in an order of nanometers (nm), a period of time that is about 5 to 10 times as long as an electroplating method is required to close the micropipe. In this case, a reaction material is formed over a long time in order to close the micropipe, so that the reaction material spreads into and is deposited inside the micropipe due to a rectilinear propagation property of the reaction material. In this case, if the reaction material is a conductive material such as a metal material, an electric conduction between the upper surface and the lower surface occurs more easily and a submount with low reliability may be obtained.

In the present embodiment, an upper end of the micropipe 11 is closed by forming the first seed layer 21 made of a metal material on the upper surface 10a of the single crystal SiC and forming the first plated layer 31 on the first seed layer 21, using an electroplating method. Accordingly, since the first plated layer 31 is formed only on the first seed layer 21 that is a metal material, the micropipe 11 can be reliably closed while preventing the first plated layer 31 from spread on the inside of the micropipe 11.

Hereinafter, main members used in the submount 100 will be described in detail.

Single Crystal SiC 10

As the single crystal SiC 10, a single crystal SiC with an insulating property can be used. For example, a single crystal SiC with a specific resistance of $1 \times 10^7$ Ω·cm or more can be used. A shape of the single crystal SiC 10 may be, for example, a rectangular parallelepiped or a triangular prism.

A thickness of the single crystal SiC 10 can be set to 50 μm or more and 400 μm or less and preferably 100 μm or more and 300 μm or less. If the thickness is too small, due to a difference between a thermal expansion coefficient of a material constituting a semiconductor laser element 300 or the base 400 and a thermal expansion coefficient of the single crystal SiC 10, the single crystal SiC 10 may deform by bending upward or downward. Setting the thickness to a certain thickness or more as described above allows suppressing deformation of the single crystal SiC 10. In addition, if the thickness is too large, increased thermal resistance may cause a decline in heat radiation when mounting the semiconductor laser element 300 or the like. However, by setting the thickness to a certain thickness or less as described above, a decline in heat radiation can be suppressed.

The micropipe 11 is a hollow pipe-like defect that extends mainly in a crystal growth direction (a direction perpendicular to a C-plane of a crystal) of the single crystal SiC 10. Not all micropipes 11 necessarily extend in a constant direction, and some micropipes 11 extend diagonally with respect to the C-plane while some micropipes 11 are at least partially bent. According to the present embodiment, since the first plated layer 31 is only formed in a part where the first seed layer 21 is formed, leakage can be suppressed.

For example, a diameter of the micropipe 11 is preferably 0.1 μm or more and 100 μm or less, more preferably 0.1 μm or more and 60 μm or less, and further preferably 0.1 μm or more and 40 μm or less. Within these ranges, the effect of closing micropipes becomes more pronounced in the case where the diameter of the micropipe 11 is 1.5 μm or more. In the case where the single crystal SiC 10 includes a plurality of the micropipes 11, it is not necessary that diameters of all the micropipes are in the range described above.

First Seed Layer 21

The first seed layer 21 is provided on the upper surface 10a of the single crystal SiC in order to grow the first plated layer 31 thereon. A material of the first seed layer 21 can be selected in consideration of adhesion with the single crystal SiC 10, resistance to the plating solution, and surface stability of a surface of the first seed layer 21. The first seed layer 21 is made of a metal material and includes at least one of, for example, Ti, Pt, Au, Ni, Pd, and Cu. The first seed layer 21 may have either a single layer structure or a multilayer structure. In the present embodiment, Ti/Pt/Au is used as the first seed layer 21.

A thickness of the first seed layer 21 can be preferably set to 0.02 μm or more and 1.5 μm or less, more preferably set to 0.1 μm or more and 1.2 μm or less, and further preferably set to 0.3 μm or more and 1.0 μm or less. Setting the thickness to be a certain amount of thickness or more as described above allows the first seed layer 21 to be reliably formed on the upper surface 10a of the single crystal SiC. In addition, by setting the film thickness to a certain film thickness or less as described above, productivity can be improved and, at the same time, an occurrence of a leakage in the case where the metal material constituting the first seed layer 21 spreads into the micropipe 11 can be suppressed.

First Plated Layer 31

The first plated layer 31 is formed on the upper surface of the first seed layer 21 and closes the micropipe 11. In this case, preferably, the micropipe 11 has a hollow interior. Accordingly, an occurrence of a leakage can be suppressed. Moreover, as long as a leakage does not occur, a partial spread of the first plated layer 31 into the upper end of the micropipe 11 is considered to be within the scope of the present invention. In order to secure an insulating property, a length of a hollow among the interior of the micropipe must be 1.5 µm or more. It is considered that providing a hollow with a length of 1.5 µm or more allows a breakdown voltage to be set to 250 V or higher. However, since the breakdown voltage is preferably 250 V or higher, a hollow with the length of 15 µm or more is preferably provided in order to obtain better insulating property. Furthermore, although it is expected that an insulation breakdown may not occur below 500 V as long as a hollow with a length of 30 µm or more is provided, a hollow with a length of 30 µm or more is preferably provided in order to increase a withstand voltage of the single crystal SiC 10 while securing a breakdown voltage of 500 V in a preferable embodiment.

A thickness of the first plated layer 31 can be appropriately selected and can be formed in accordance with the diameter of the micropipe 11. For example, the thickness can be preferably set to 1 µm or more and 100 µm or less, more preferably set to 5 µm or more and 50 µm or less, and further preferably set to 10 µm or more and 30 µm or less. Setting the thickness to a certain thickness or more as described above allows for reliably closing the micropipe 11. In addition, setting the thickness to a certain thickness or less as described above allows for reducing a thickness of the submount as a whole, so that thermal resistance can be prevented from increasing.

In addition, setting the thickness to a certain thickness or less is also preferable from the perspective of productivity.

As the first plated layer 31, a metal material is used. For example, while Cu, Ni, Pd, Au, CuPd, a NiPd alloy, or the like can be used, Cu is preferably used from the perspective of heat radiation. Generally, since a metal material has a higher thermal conductivity than an insulating material, a decline in heat radiation of the submount as a whole can be suppressed by coating the micropipe 11 with the metal material.

Next, a manufacturing method of the submount 100 will be described in detail with reference to FIGS. 2 to 4.

Preparing Single Crystal SiC 10

First, as shown in FIG. 2A, the single crystal SiC 10 including the micropipe 11 penetrating from the upper surface 10a to the lower surface 10b is prepared. In the present embodiment, a wafer-state single crystal SiC 10 is prepared and the single crystal SiC 10 is singulated to obtain a plurality of submounts. However, the present embodiment is not limited thereto, and a single crystal SiC that can serve as a single submount may be provided as the single crystal SiC 10. Preferably, a wafer-like single crystal SiC 10 is prepared due to its suitability for mass production. In the present specification, an "upper surface" may also be referred to as a "first surface" and a "lower surface" may also be referred to as a "second surface".

Forming First Seed Layer 21

Next, as shown in FIG. 2B, the first seed layer 21 made of a metal material is formed on the upper surface 10a of the single crystal SiC. While a method of forming the first seed layer 21 is not particularly limited, for example, the first seed layer 21 may be formed using a sputtering method. In the case where a wafer-like single crystal SiC 10 is prepared, a mask or the like may be formed in a region to be divided in a singulating step (a peripheral portion of a region to become the submount 100). In a case where this mask is formed, the mask is to be removed after the first plated layer 31 forming step and before the singulating step. Accordingly, the first seed layer 21 is not formed in the region to be divided in the singulating step, so that cracking or the like caused by the division can be suppressed.

Figure 4A:
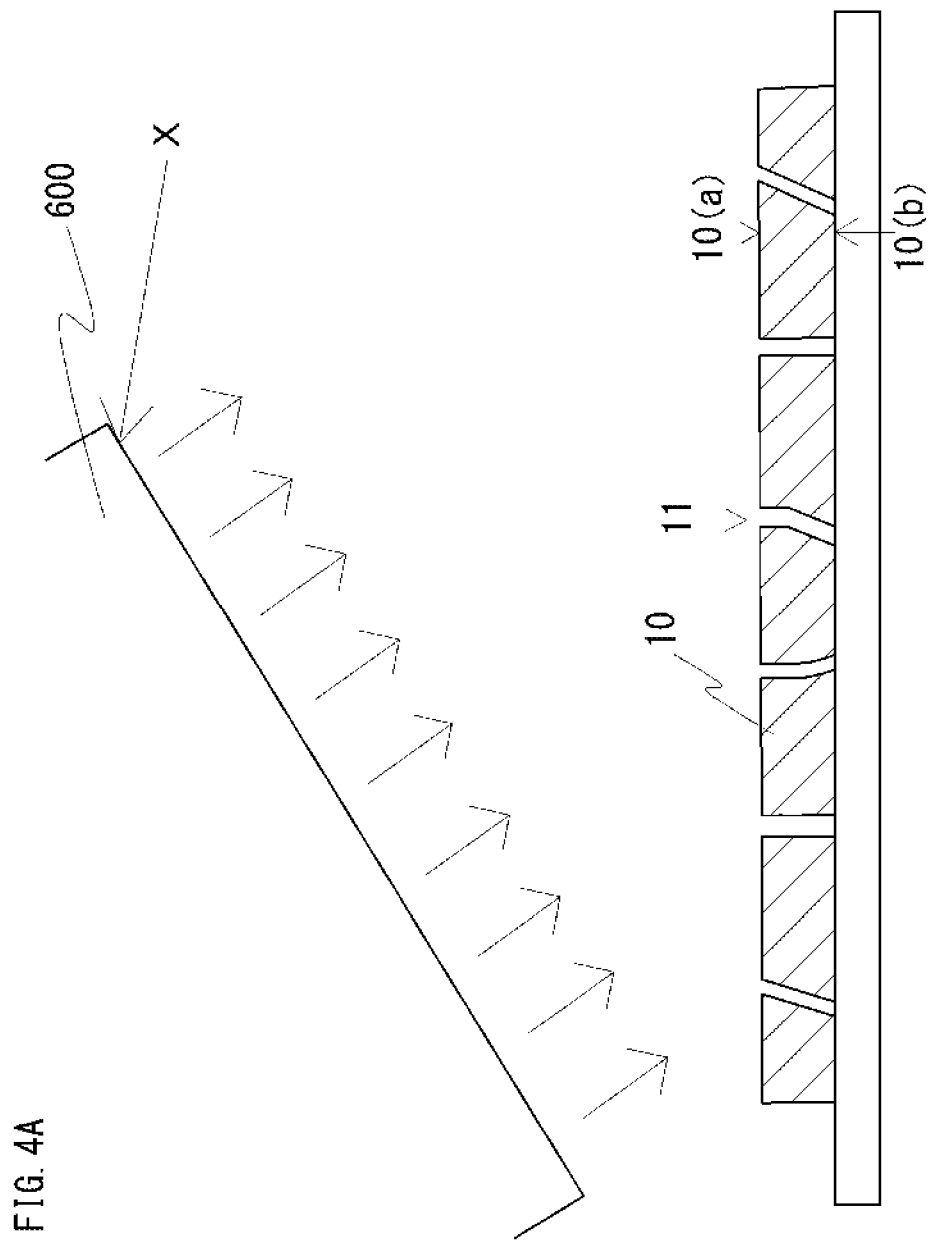

In the case where the first seed layer 21 is formed by using a sputtering method, as shown in FIG. 4A, the first seed layer 21 can be formed in a state where the upper surface 10a of the single crystal SiC is not parallel to (that is, in a state where the upper surface 10a is inclined with respect to) a target surface X of a sputtering target 600. In other words, the single crystal SiC 10 may be arranged so that a target (a material of the first seed layer 21) is sputtered from a diagonal direction with respect to the upper surface 10a of the single crystal SiC. Accordingly, the material constituting the first seed layer 21 can be prevented from entering the micropipe 11.

As an alternative method, as shown in FIG. 4B, a second mask 62 closing the micropipe 11 can be formed before forming the first seed layer 21. Accordingly, since the material of the first seed layer 21 can be prevented from spreading into the micropipe 11, the first plated layer 31 can be less easily formed inside the micropipe 11. In the present embodiment, forming the second mask 62 inside the micropipe 11 and on the upper surface 10a of the single crystal SiC and subsequently removing the second mask 62 until the upper surface 10a of the single crystal SiC is exposed allows for providing the second mask 62 inside the micropipe 11. Besides this method, the second mask 62 can be formed inside the micropipe 11 and on the upper surface 10a of the single crystal SiC, and after exposing the entire surface of the second mask, the second mask 62 formed on the upper surface 10a of the single crystal SiC can be developed while leaving the second mask 62 inside the micropipe 11. Moreover, in the case of forming the second mask 62, the second mask 62 is removed after forming the first seed layer 21.

Forming First Mask 61

Figure 2C:
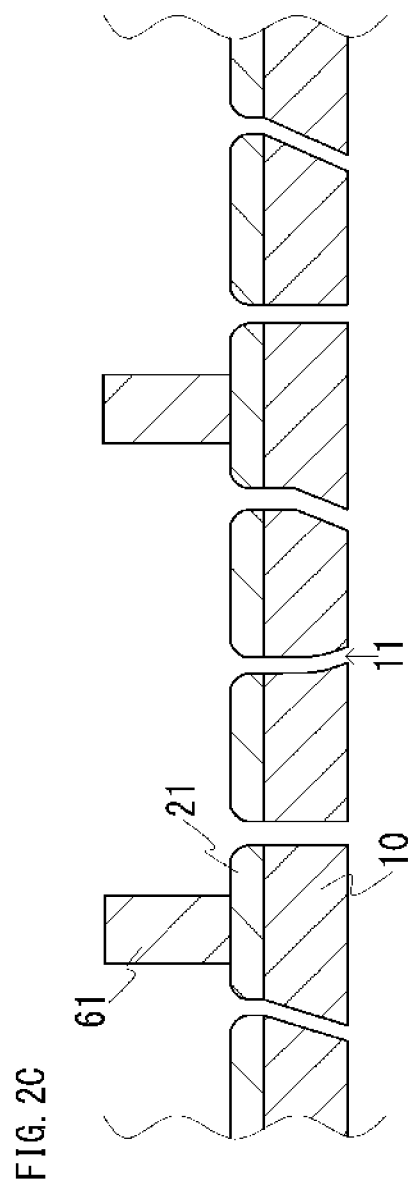
Figure 3A:
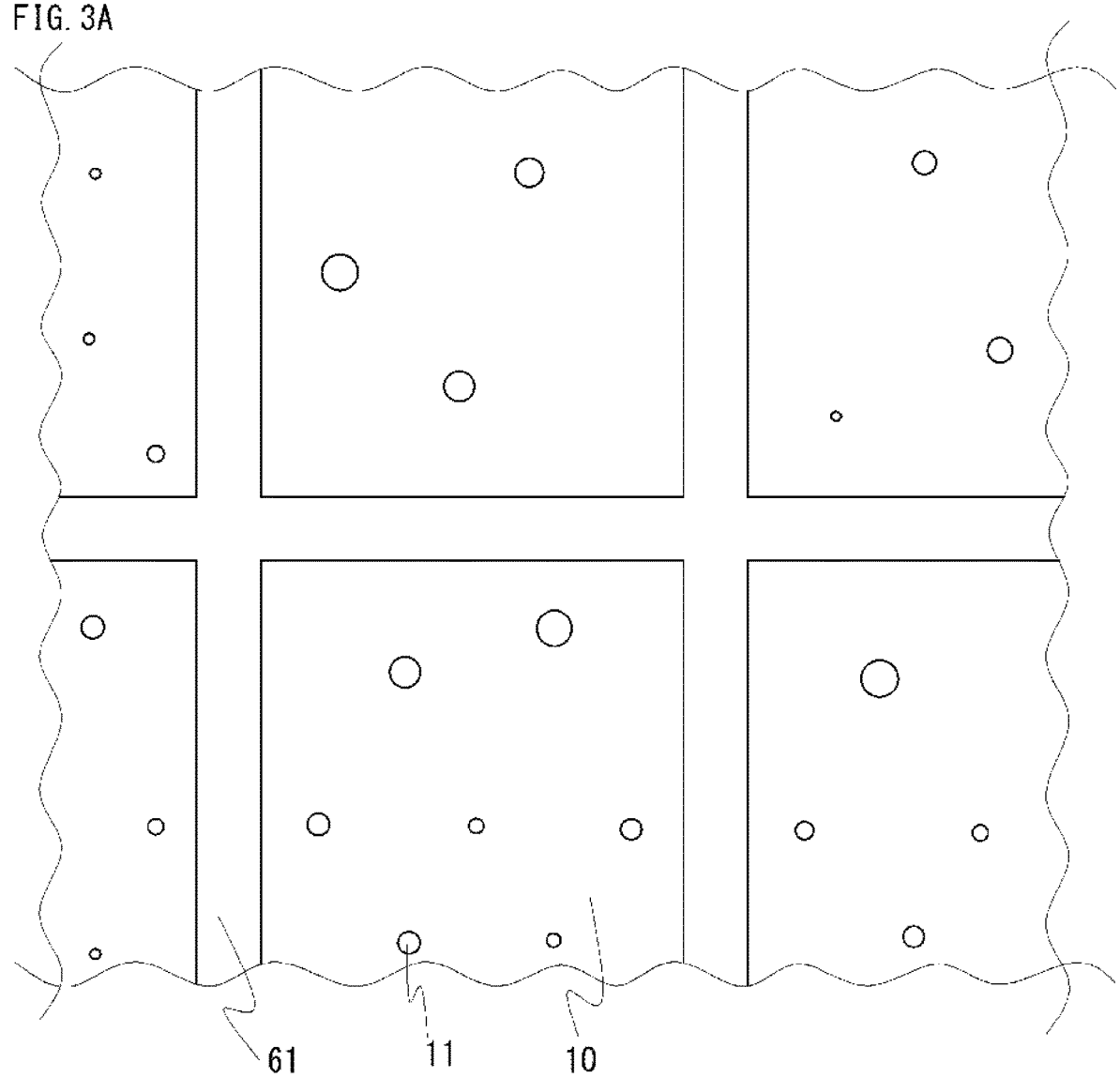
FIG. 3A is a schematic plan view of FIG. 2C

Next, as shown in FIG. 2C, the first mask 61 formed by using photolithography method is provided over the wafer-state single crystal SiC 10. In this step, as shown in FIG. 3A, a grid-like first mask 61 that covers an outer edge of a region to become a single submount in a top view is arranged. Accordingly, the first plated layer 31 can be selectively formed in a non-masked part (a region excluding the outer edge of the region to become a submount). If the first plated layer 31 is formed in a region to be singulated, a burr may occur upon division. However, selectively not providing the first plated layer 31 allows for suppressing a generation of a burr. As the first mask 61, for example, a photoresist can be used. A width of the first mask 61 is preferably set to 100 µm or less. Accordingly, a formation area of the first plated layer 31 can be sufficiently secured. In addition, the width of the first mask 61 is preferably set to 10 µm or more in order to reliably prevent a burr from generating during division. This step is also preferably performed in the case where a mask similar to the first mask is formed in the first seed layer 21 forming step described above.

Forming First Plated Layer 31

Next, as shown in FIG. 2D, the first plated layer 31 is formed on the first seed layer 21 by using an electroplating method to close an upper end of the micropipe 11. Forming the first plated layer 31 by an electroplating method allows the first plated layer 31 to be formed only around the first seed layer 21 without forming the first plated layer 31 inside the micropipe 11. In addition, since an electroplating method enables the micropipe 11 to be closed in a short period of time as compared to conventional methods, an electroplating method is suitable for mass production. Setting a condition of forming the first plated layer 21 to be a condition that facilitates growth in a lateral direction with respect to the thickness of the first seed layer 21, the micropipe 11 can be closed in a shorter period of time. For example, a condition that enables an opening with a diameter of 100 μm to be completely closed by the time the thickness of the first plated layer 31 becomes 50 μm can be used and, preferably, a condition that enables an opening with a diameter of 100 μm to be completely closed by the time the thickness of the first plated layer 31 becomes 45 μm is used.

Planarizing

Figure 2E:
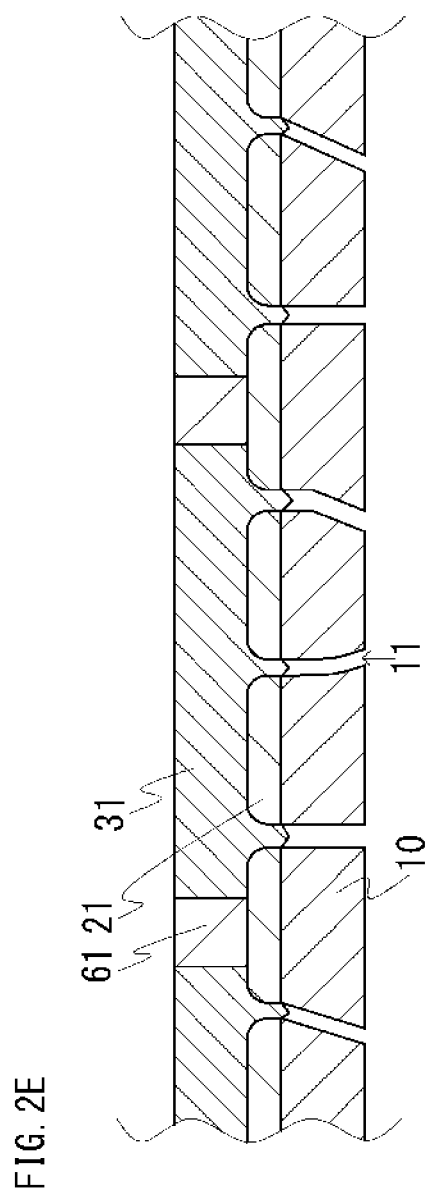

Next, as shown in FIG. 2E, a part of the first plated layer 31 is removed from an upper surface side of the first plated layer 31 to planarize the upper surface. In this case, the first plated layer 31 is partially left unremoved. If a recessed part or a protruding part exists on the upper surface of the first plated layer 31, a void may occur in a eutectic solder that is used when mounting the submount 100 on the base 400 or the like and thus may cause a decline in bonding strength or a deterioration in heat radiation. However, by performing planarization, an occurrence of such a void can be suppressed. It is to be understood that "planar" as used herein includes cases where the surface is completely planar as well as cases where the surface is rough as long as the roughness has no effect on mounting. Specifically, it is to be understood that the term "planar" includes cases where a surface roughness (Ra) is 300 nm or less.

For planarizing, for example, a polishing device, a grinder, or a surface planar can be used.

A thickness of the first plated layer 31 after planarization can preferably be set to 2.5 μm or more and 100 μm or less, more preferably set to 5 μm or more and 75 μm or less, and further preferably set to 10 μm or more and 50 μm or less. Setting the thickness of the first plated layer 31 after planarization to be a certain amount of thickness or less within the ranges described above allows the thickness of the submount 100 to be reduced, and setting the film thickness to be a certain amount of thickness or more within the ranges described above allows the first plated layer 31 to absorb stress due to a load when mounting the submount 100 on another member and thus cracking of the submount 100 can be reduced.

Removing First Mask 61

Figure 2F:
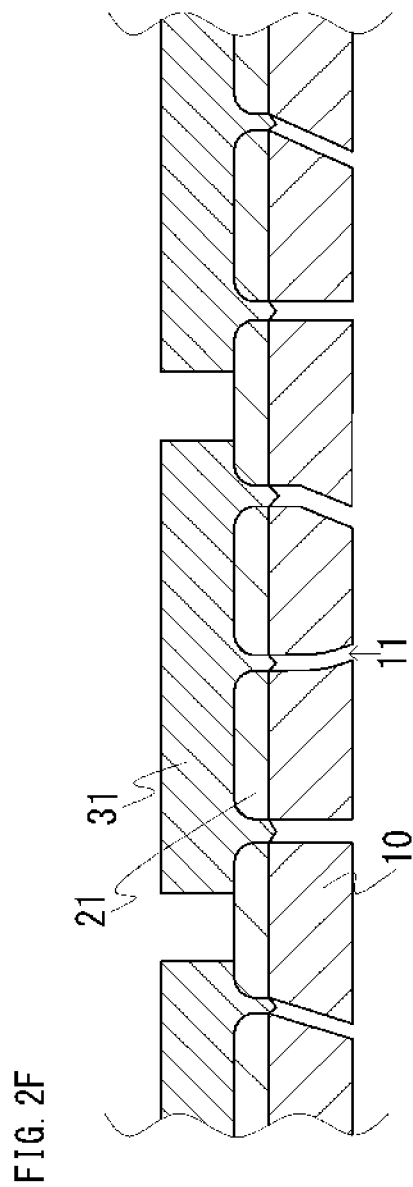

Next, as shown in FIG. 2F, the first mask 61 is removed.

Singulating

Figure 3B:
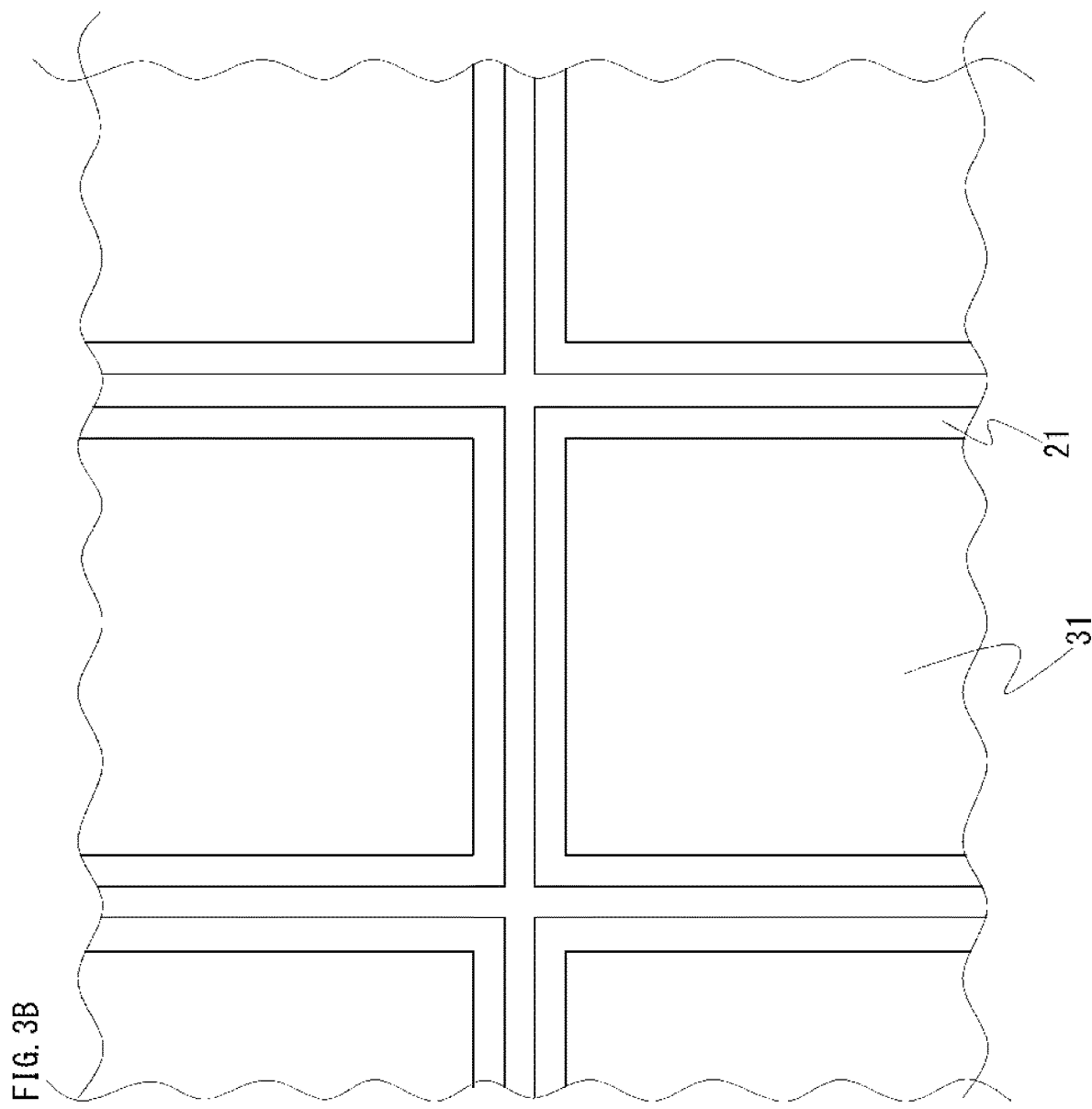
FIG. 3B is a schematic plan view of FIG. 2G.

Next, as shown in FIG. 2G, the wafer-like single crystal SiC 10 is divided to be singulated. The division is performed by dicing, laser scribing, cutter scribing, or the like. At this time, as shown in FIG. 3B, the division is preferably performed in a region from which the first mask 61 has been removed (in other words, a region in which the first plated layer 31 is not formed). Accordingly, a generation of a burr due to the first plated layer 31 upon division can be suppressed.

In the present embodiment, the submount 100 is formed by the steps described above. However, the first mask 61 forming step, the planarizing step, and the first mask 61 removing step are not essential steps.

In addition, in the case where a single crystal SiC to be used as a single submount (in other words, a single crystal SiC that has already been singulated) is prepared in the single crystal SiC 10 preparing step, the first mask 61 forming step, the first mask 61 removing step, and the singulating step can be omitted.

Second Embodiment

Figure 5:
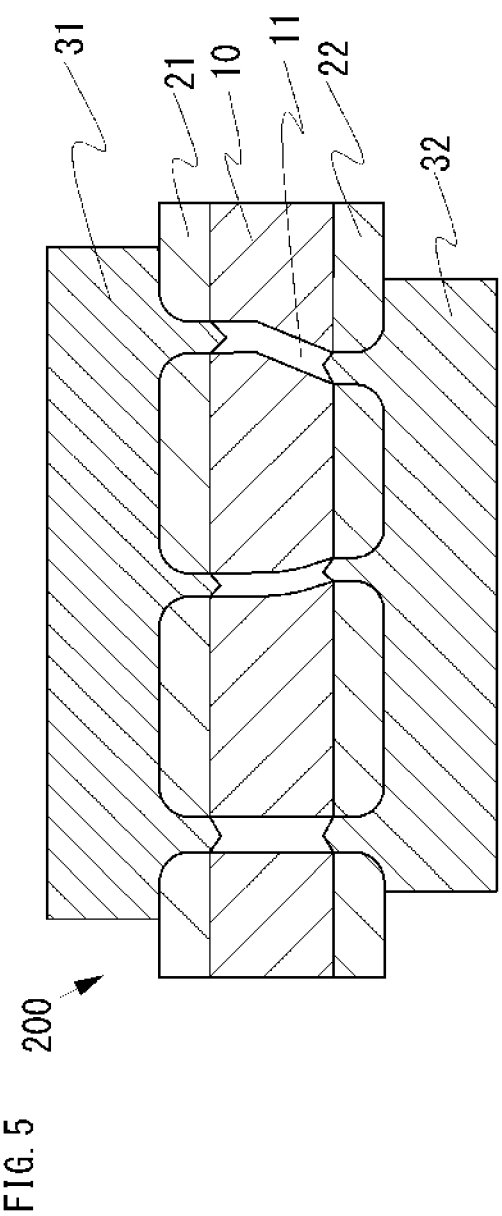
FIG. 5 is a schematic sectional view of a submount 200 according to a second embodiment.

FIG. 5 shows a submount 200 according to the present embodiment. The submount 200 differs from the submount 100 described in the first embodiment in that, in addition to the upper surface 10a of the single crystal SiC, a second seed layer 22 and a second plated layer 32 are also formed on a lower surface 10b. Accordingly, since both the upper end and the lower end of the micropipe 11 can be closed, an occurrence of a leakage during use of the single crystal SiC as a submount can be more easily suppressed. In addition, stress due to a load when mounting a semiconductor laser element or the like on the lower surface of the submount can be reduced.

In the present embodiment, the first mask 61 forming step and subsequent steps differ from the first embodiment. Differences of a manufacturing method of the submount 200 according to the present embodiment from the first embodiment will now be described with reference to FIGS. 6A to 6F.

Forming Seed Layer

As shown in FIG. 6A, a first seed layer 21 and a second seed layer 22 are respectively formed on the upper surface 10a and the lower surface 10b of a prepared single crystal SiC. The second seed layer 22 can be formed by a similar method to the first seed layer 21. At this time, a mask pattern for recognizing a mounting position is to be formed on a surface of a side on which the semiconductor laser element 300 is to be mounted.

Forming First Mask 61

Next, as shown in FIG. 6B, first masks 61 is formed by photolithography on both surfaces on the side of the upper surface 10a and the side of the lower surface 10b of the single crystal SiC. At this time, the first masks 61 may be formed so that widths of the first mask 61 provided on the upper surface 10a side and the first mask 61 provided on the lower surface 10b side are set the same. Alternatively, the first masks 61 may be formed so that the width of the first mask 61 provided on the lower surface 10b side is greater than the width of the first mask 61 provided on the upper surface 10a side.

Forming Plated Layer

Next, as shown in FIG. 6C, the first plated layer 31 and the second plated layer 32 are respectively formed on the first seed layer 21 and the second seed layer 22 respectively provided on the upper surface side and the lower surface side of the single crystal SiC 10 by an electroplating method. Accordingly, both the upper end and the lower end of the micropipe 11 can be closed. For the second plated layer 32, a similar configuration to the first plated layer 31 can be adopted. While the first plated layer 31 and the second plated layer 32 may be given different thicknesses, the thicknesses are preferably the same. Accordingly, the first plated layer 31 and the second plated layer 32 can be simultaneously formed.

Planarizing

Figure 6D:
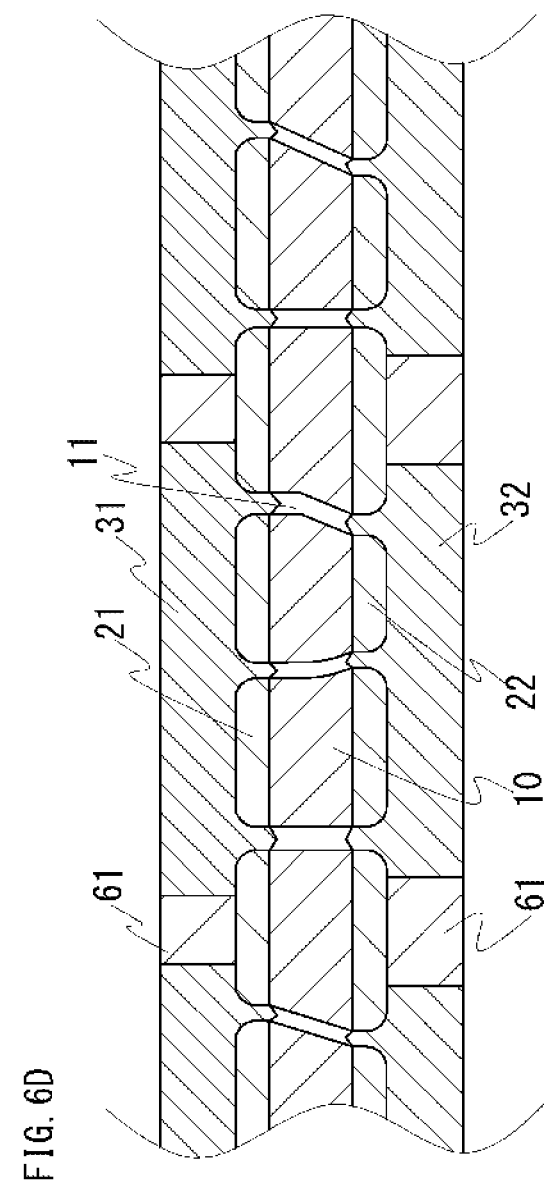

Next, as shown in FIG. 6D, the first plated layer 31 on the upper surface side of the single crystal SiC 10 and the second plated layer 32 on the lower surface side of the single crystal SiC 10 are respectively planarized. Thicknesses of the first plated layer 31 and the second plated layer 32 after planarization may be the same or may differ from each other. In the case where the thicknesses of the plated layers are different from each other, the base 400 is preferably mounted on a side on which the thicker plated layer of these plated layers is formed. Generally, since an area of the submount to which the base 400 is to be connected is larger than an area of the submount to which the semiconductor laser element 300 is to be connected, the submount is more susceptible to cracking due to stress or the like. Forming the plated layer to be thick allows stress or the like to be absorbed by the plated layer, so that the submount is less likely to crack.

Removing First Mask 61

Figure 6E:
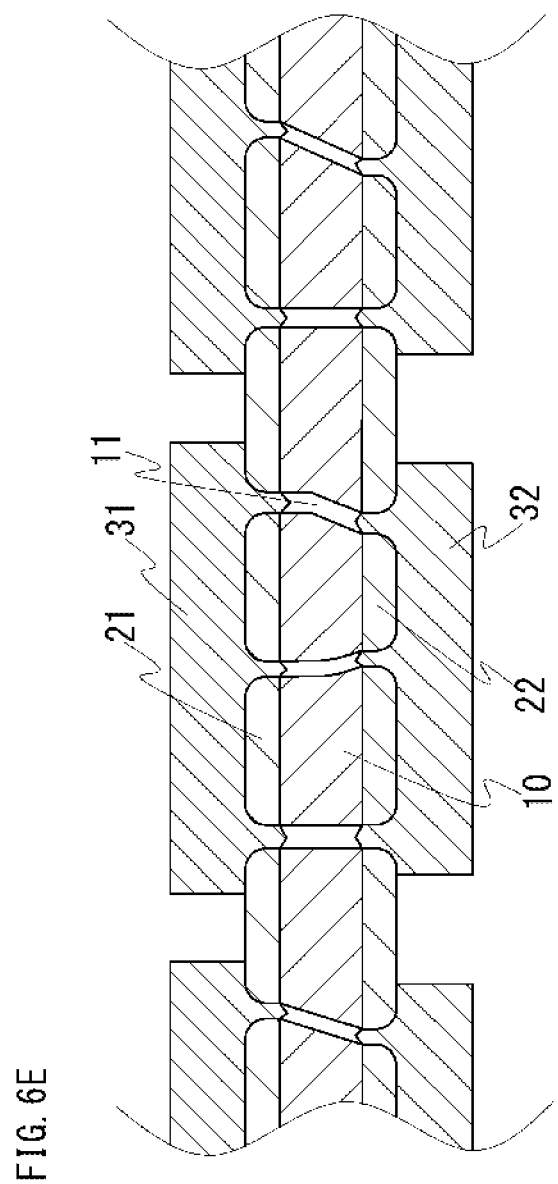

Next, as shown in FIG. 6E, the first mask 61 is removed.

Singulating

Figure 6F:
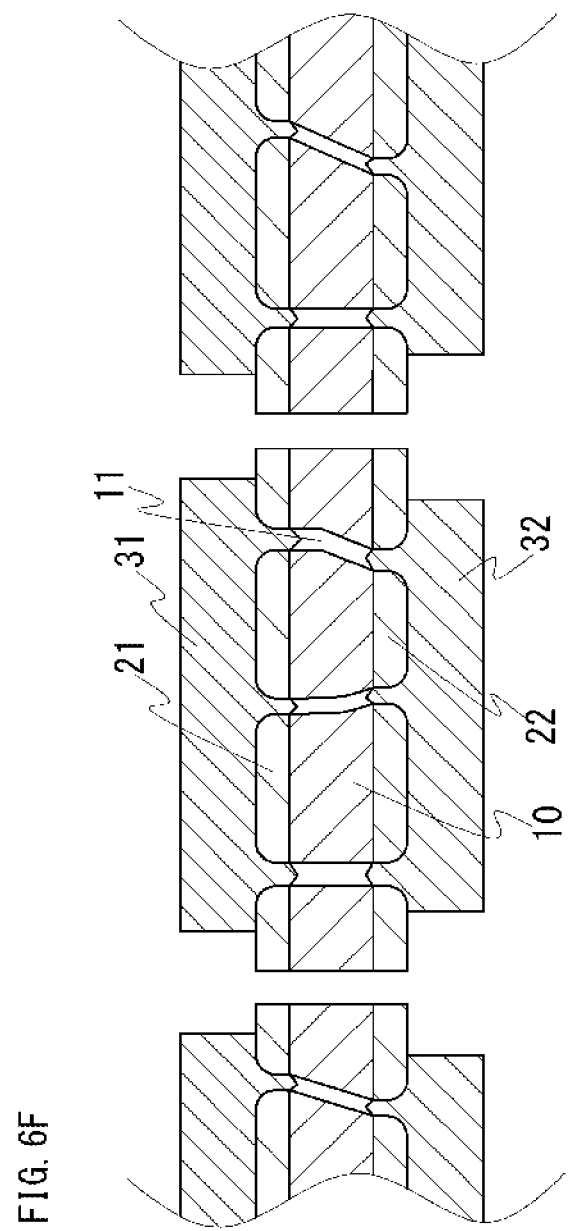

Next, as shown in FIG. 6F, the wafer-like single crystal SiC 10 is divided and singulated. At this time, the division is preferably performed in a region from which the first mask 61 has been removed (in other words, a region in which the second plated layer 32 is not formed). Accordingly, an occurrence of a burr due to the second plated layer 32 upon division can be suppressed.

In the present embodiment, the submount 200 is formed by the steps described above. However, the first mask 61 forming step, the planarizing step, and the first mask 61 removing step are not essential steps. In addition, when the single crystal SiC 10 to be used as a single submount (in other words, the single crystal SiC 10 that has already been singulated) is prepared in the single crystal SiC 10 preparing step, the first mask 61 forming step, the first mask 61 removing step, and the singulating step can be omitted.

Third Embodiment

Figure 7A:
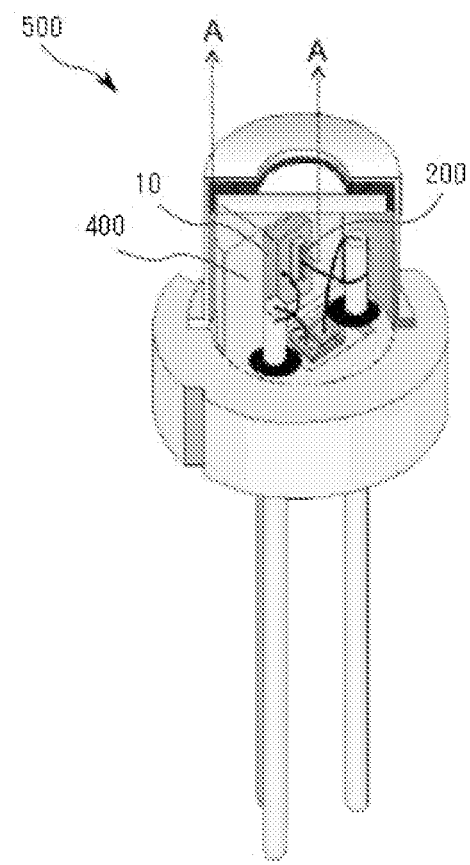
FIG. 7A is a schematic perspective view of a semiconductor laser device 500 according to a third embodiment.
Figure 7B:
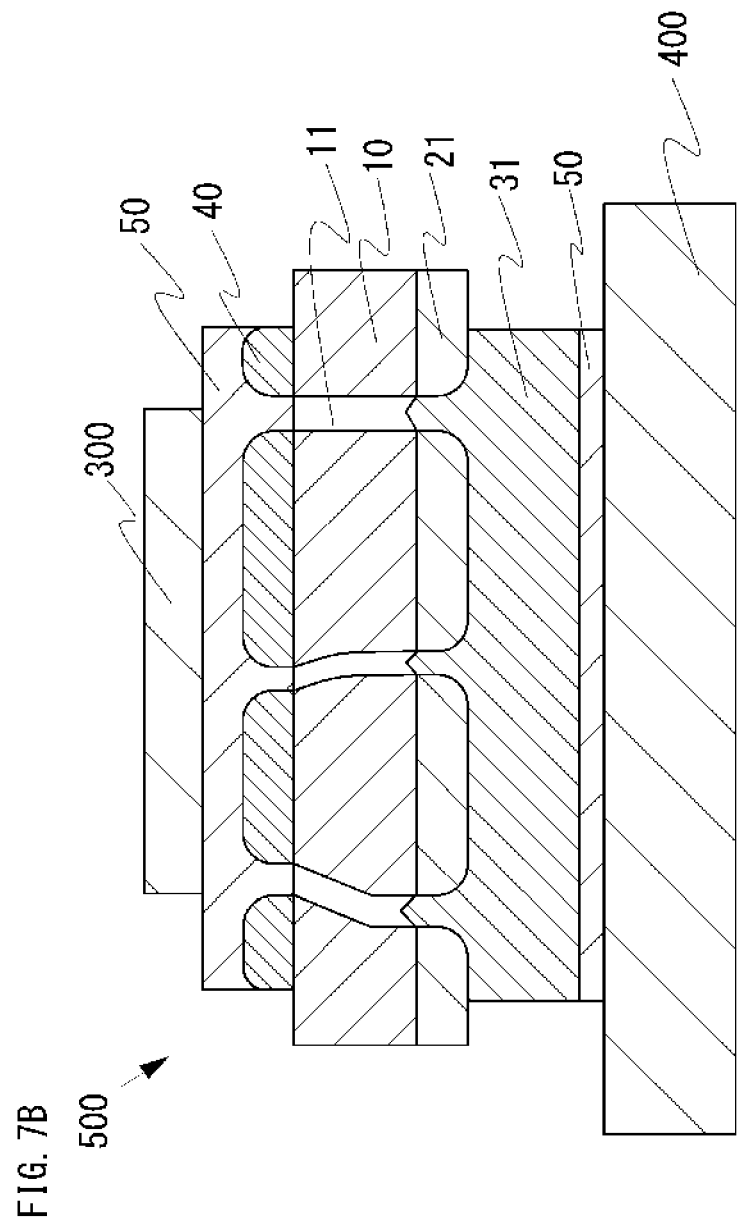
FIG. 7B is a schematic sectional view taken along A-A in FIG. 7A.

FIG. 7 shows a semiconductor laser device 500 according to the present embodiment. FIG. 7A is a schematic perspective view of the semiconductor laser device 500 according to the present embodiment, and FIG. 7B is a schematic sectional view of the semiconductor laser device 500 taken along A-A according to the present embodiment. In FIG. 7B, a first surface is shown in the lower side and a second surface is shown in the upper side for convenience.

The semiconductor laser device 500 according to the present embodiment includes a semiconductor laser element 300 mounted on a low surface side of a submount 100 via a conductive member 50 (in the present embodiment, a eutectic solder). Since the micropipe 11 is reliably closed by the first plated layer 31, even when the semiconductor laser element 300 is mounted with the eutectic solder, the highly-reliable semiconductor laser device 500 in which leakage is suppressed can be obtained.

Semiconductor Laser Element 300

The semiconductor laser element 300 is mounted on the lower surface side of the single crystal SiC 10 via a eutectic solder. In a case where a member with high fluidity such as a eutectic solder is used, since the eutectic solder can easily spread into the micropipe 11, the effect of closing a micropipe may become pronounced. An intermediate layer 40 can be provided between the conductive member 50 and the single crystal SiC 10. The intermediate layer 40 can be formed by using a known method such as a sputtering method. A material for the intermediate layer 40 can be selected in consideration of adhesion with the first plated layer 31 and/or dispersion of the eutectic solder. For example, Ti, Ni, Pd, Pt, Cu and/or Au can be used. A film thickness of the intermediate layer 40 can be preferably set to 0.02 μm or more and 1.5 μm or less, more preferably set to 0.1 μm or more and 1.2 μm or less, and further preferably set to 0.3 μm or more and 1.0 μm or less.

Various semiconductor laser elements including GaN-based and GaAs-based semiconductor laser elements can be used as the semiconductor laser element 300. Since GaN has a small difference in thermal expansion coefficients from the single crystal SiC 10 and a GaN-based semiconductor laser element has a higher drive voltage and generates heat more readily than a GaAs-based semiconductor laser element, a GaN-based semiconductor laser element is particularly preferably used.

In addition to low-output (for example, equal to or lower than 0.5 W) semiconductor laser elements, high-output (for example, equal to or higher than 1 W and particularly equal to or higher than 3.5 W) semiconductor laser elements can be used as the semiconductor laser element 300. Since a high-output semiconductor laser element generates more heat than a low-output semiconductor laser element, the configuration of the present embodiment which use the single crystal SiC 10 with high heat radiation as a submount are suitable for a semiconductor laser device using a high-output semiconductor laser element.

In this case, the submount 100 in which the first plated layer 31 is formed only on the upper surface can be used, or the submount 200 in which plated layers (the first plated layer 31 and the second plated layer 32) are formed on both the upper surface and the lower surface can be used. Although a thickness of the submount as a whole increases, forming plated layers on both the upper surface and the lower surface allows stress due to a load upon mounting the semiconductor laser element 300 on the submount can be absorbed by the plated layers. In addition, mounting the semiconductor laser element 300 on the lower surface 10b of the submount 100 in which the first plated layer 31 is formed only on the upper surface 10a, allows the semiconductor laser element 300 to be directly mounted on the single crystal SiC 10 using a conductive member or the like, so that preferable heat radiation from the semiconductor laser element 300 to the submount can be realized.

Conductive Member 50

For the conductive member 50, while a eutectic solder, Au nanoparticles, or the like can be used, a eutectic solder is preferably used. As the eutectic solder, for example, an Au-based solder material such as AuSn-based solder, AuGe-based solder, AuSi-based solder, AuNi-based solder, AuPdNi-based solder, or the like, an Ag-based solder material such as AgSn-based solder, or the like can be used. In the present embodiment, AuSn-based solder is used. A eutectic solder is at least used for adhesion between the submount and the semiconductor laser element 300 and preferably also used for adhesion between the submount and the base 400.

Hereinafter, a manufacturing method of the semiconductor laser device 500 according to the present embodiment will be described with reference to FIGS. 8A and 8B. In FIGS. 8A and 8B, a first surface is shown in a lower side and a second surface is shown in an upper side for convenience.

First, a submount obtained by the submount manufacturing method described above is prepared. While the submount 100 according to the first embodiment can be prepared in the present embodiment, the submount 200 according to the second embodiment may be prepared instead.

Next, as shown in FIG. 8A, the intermediate layer 40 is formed on a lower surface of the submount 100. At this time, there may be a portion where the intermediate layer 40 is not formed. For example, preferably, there may be a portion where the intermediate layer 40 is not provided using a mask or the like on a peripheral edge part of the submount. Accordingly, dispersion of the eutectic solder can be more easily suppressed and a variation in mounting positions can be reduced.

Next, as shown in FIG. 8B, the semiconductor laser element 300 is mounted on a lower surface side of the submount 100 via the conductive member 50. Adhesion by the eutectic solder can be performed by, for example, melting the eutectic solder by applying heat and subsequently applying a load. At this time, since not only spread of the eutectic solder on the side of the base 400 into the micropipe 11 is suppressed by the first plated layer 31 but the micropipe 11 is also closed on one of the surfaces, spread of the eutectic solder on the side of the semiconductor laser element 300 into the micropipe 11 can also be suppressed. In addition, in the case of using the submount 200 according to the second embodiment, spread of the eutectic solder from the side of the semiconductor laser element 300 can be prevented more reliably.

The submount prepared in the present embodiment may be in a wafer state after the first mask 61 removing step and before the singulating step. In this case, after forming the intermediate layer 40 in the wafer state, singulation can be performed before mounting the semiconductor laser element 300.

While the single crystal SiC is used as a submount of a semiconductor laser device in the present embodiment, the single crystal SiC can also be used in devices other than a semiconductor laser device such as an LED (Light Emitting Diode) device. Since a semiconductor laser element has extremely smaller area of a light-emitting region among an area of the entire element in contrast to an LED element, heat tends to concentrate in the light-emitting region. Accordingly, high heat radiation tends to be required for a semiconductor laser element. For this reason, a single crystal SiC that is a material with superior thermal conductivity can be particularly suitable as a submount (heat sink) on which a semiconductor laser element is to be mounted.

What is claimed is:

1. A submount comprising:
a single crystal SiC including an upper surface and a lower surface and provided with a micropipe comprising a hollow interior and penetrating from the upper surface to the lower surface;
a first seed layer made of a metal material and provided on the upper surface of the single crystal SiC; and
a first plated layer provided on an upper surface of the first seed layer so as to close an upper end of the micropipe,
wherein the first plated layer covers a lateral surface of the first seed layer so as to directly close the upper end of the micropipe.

2. The submount according to claim 1, wherein
a second seed layer made of a metal material is provided on the lower surface of the single crystal SiC, and
a second plated layer that closes a lower end of the micropipe is provided on the lower surface of the second seed layer.

3. The submount according to claim 2, wherein a thickness of the first plated layer is greater than a thickness of the second plated layer.

4. The submount according to claim 1, wherein the first plated layer is formed only on the upper surface side of the single crystal SiC.

5. The submount according to claim 1, wherein the first seed layer has a thickness of 0.02 μm or more and 1.5 μm or less.

6. The submount according to claim 1, wherein the first plated layer has a thickness of 1 μm or more and 100 μm or less.

7. The submount according to claim 1, wherein the first seed layer includes at least one of Ti, Pt, Au, Ni, Pd, and Cu, and the first plated layer is made of Cu.

8. A semiconductor laser device comprising the submount according to claim 1, wherein a semiconductor laser element is mounted on a lower surface side of the submount via a conductive member.

9. The semiconductor laser device according to claim 8 wherein the conductive member is a eutectic solder.

10. The semiconductor laser device according to claim 8, wherein an intermediate layer is provided between the conductive member and the single crystal.

11. The submount according to claim 1, wherein a length of a hollow interior among the interior of the micropipe is 1.5 μm or more.

12. The submount according to claim 1, wherein a length of a hollow interior among the interior of the micropipe is 15 μm or more.

13. The submount according to claim 1, wherein a length of a hollow interior among the interior of the micropipe is 30 μm or more.

14. The submount according to claim 1, wherein a diameter of the micropipe is 0.1 μm or more and 100 μm or less.

15. The submount according to claim 1, wherein the micropipe is a hollow pipe-like defect of the single crystal SiC, wherein the defect includes at least one of (a) a defect that extends in a direction perpendicular to a C-plane of a crystal, (b) a defect that extends diagonally with respect to the C-plane, and (c) a defect that is at least partially bent.

* * * * *